United States Patent Office 2,978,390
Patented Apr. 4, 1961

2,978,390

GOLD PLATING SOLUTIONS

Arthur R. Atwater, East Orange, and Edward M. Julich, Old Tappan, N.J., assignors to Bell Telephone Laboratories Incorporated, New York, N.Y., a corporation of New York No Drawing. Filed July 22, 1957, Ser. No. 673,143

8 Claims. (Cl. 204—46)

This invention relates to plating solutions, and more particularly to gold plating solutions.

Electrical members are commonly gold plated where high conductivity, resistance to high temperature, and prevention of oxidation are important considerations. In the printed circuit art, it is frequently desired to plate a controlled amount of gold upon a copper pattern in a process which, while producing a substantially non-porous surface having high abrasion resistance, does not deleteriously affect the bond between the copper pattern and its underlying base material.

An object of this invention is an improved gold plating solution.

More specifically, an object of the present invention is a gold plating solution which produces a substantially non-porous surface.

A further object of this invention is a plating solution which does not affect the bond between the plated object and its supporting medium.

A still further object of the present invention is a plating solution capable of depositing a highly adherent gold film on copper.

These and other objects of this invention are realized in an illustrative embodiment thereof wherein an acid-gold plating solution comprising either fluoboric or phosphoric acid is employed to form an impervious, adherent layer of gold upon a copper surface.

Accordingly, a feature of this invention is a gold plating bath comprising a member selected from the group consisting of fluoboric and phosphoric acids.

A solution illustrative of the present invention may advantageously be employed in printed circuit fabrication processes. A specific description of one such process will serve to illustrate the manner in which the principles of this invention may be practiced.

As is well known, the preparation of surfaces for plating is as important as the plating operation itself. Accordingly, the first step in the described process is to clean a copper-clad board in a thorough manner. (A copper-clad board comprises an insulated base member to which has been secured by any suitable adhesive means a layer of copper.) The copper-clad board may, for example, be cleaned with pumice and a suitable wetting agent, then rinsed in water, and finally oven-dried.

A photo-resist emulsion is then applied to the copper surface, and a positive (made from a negative which, in turn, is made from a master drawing) is employed to expose selected portions of the resist to a light source. The exposed portions are then developed, and hardened by the application of heat.

The copper-clad board is next immersed in a non-ferrous cleaner solution for about fifteen seconds at 65 degrees centigrade to remove the resist emulsion from the undeveloped portions of the copper surface. The copper-clad board is then rinsed in water, and, following the rinsing step, an acid solution (for example, three parts by volume of nitric acid to one part of water) is employed to surface-roughen the bare copper portions and to remove oxide films therefrom. Following another rinsing with water, the bare copper portions are in condition to be plated.

The heretofore described steps produce a copper-clad board having a cleaned and surface-roughened copper pattern formed thereon. This pattern, which is framed-in by the hardened resist emulsion, defines the desired printed wiring configuration.

The desired conductive pattern is next gold plated employing one or the other of the specific below-described examples of the present invention.

*Example I*

Ten grams of powdered sodium or potassium gold cyanide are dissolved in 500 cubic centimeters of distilled water, and then 20 cubic centimeters of 85 percent phosphoric acid having a specific gravity of 1.68 are slowly added thereto. Sufficient distilled water is then added to make a plating solution having a volume of 1000 cubic centimeters.

The phosphoric acid plating solution should be allowed to stand for at least 48 hours, after which time it should advantageously be filtered. The filtered solution has a pH value of 1.8.

*Example II*

Ten grams of powdered sodium or potassium gold cyanide are dissolved in 500 cubic centimeters of distilled water, and then 13 cubic centimeters of fluoboric acid are slowly added thereto. Enough additional distilled water is then added to make a plating solution having a volume of 1000 cubic centimeters.

The fluoboric acid solution should also be allowed to stand for at least 48 hours, and then be filtered. This solution also exhibits a pH value of 1.8.

One or the other of the above-described baths is then placed in a stainless steel tank. The copper-clad board is immersed in the bath, which bath should advantageously be at a temperature of 10 degrees centigrade. The copper layer of the board is connected to the negative terminal of a 3 to 4 volt direct current power supply, while the positive terminal of the supply is connected to the stainless steel plating tank.

Agitation and filtration of the baths, by any means well known to those skilled in the plating art, should advantageously be carried on during the plating process.

It has been found that a fine-grained, tenacious layer of gold is obtained by plating with the above-described baths.

Although specific requirements for the baths have been set forth, it is to be understood that these solutions will plate in an effective manner when the constituents and conditions thereof fall within the following ranges: sodium or potassium gold cyanide, 1–30 grams; 85 percent phosphoric acid, 2.5–200 cubic centimeters (or, phosphoric acid in any concentration supplying 2.125–170 cubic centimeters of the pure acid); fluoboric acid, 4–32 cubic centimeters; pH, .05–6.9; temperature, 0–70 degrees centigrade; direct current volts, 2–9. Each plating bath characterized by these constituents and conditions included sufficient distilled water to make a solution having a volume of 1000 cubic centimeters.

The next step in the described printed board fabrication process is to rinse the plated board in water, and then dry it. Next, the resist emulsion (covering the unwanted copper portions) is removed with acetone, and the unplated and unwanted copper is then removed by a ferric chloride solution, or with nitric or chromic acid, or "backed-off" by electrolysis. The processed board, after another rinsing in water, an oven drying, and a brushing to remove any loose particles of metal thereon, is a finished printed wiring assembly ready to be combined with circuit elements to form a printed circuit.

A main advantage of these described acid-gold plating baths resides in the fact that the bond between the copper layer and the base material to which the copper is adhered is not deleteriously affected to any degree during the plating operation. Pull test results on surfaces plated with the solutions of the present invention are the same as those obtained with unplated surfaces.

Additionally, the solutions of this invention provide fine-grained, practically non-porous gold coatings. This characteristic is particularly important in printed circuit fabrication techniques of the type above-described, for excessive porosity of the gold coating might allow the noted copper-removing solutions ferric chloride, et cetera) to damage the wanted copper layers upon which the gold coating is deposited.

Furthermore, the solutions of the present invention do not interact with the described resist emulsion to interfere with its action in preventing the unwanted copper portions from acquiring a gold coating during the plating process.

Also, the abrasion resistant qualities of coatings produced by these solutions are excellent compared with coatings produced by priorly known plating baths.

It is to be understood that the above-described arrangements are illustrative and not restrictive of the principles of the present invention. Other arrangements may be devised by those skilled in the art without departing from the spirit and scope of this invention.

What is claimed is:

1. A gold plating bath consisting of a solution made up by mixing sodium gold cyanide, distilled water, and a member selected from the group consisting of phosphoric and fluoboric acids, said bath having a pH value of 1.8.

2. A gold plating bath consisting of a solution made up by mixing potassium gold cyanide, distilled water, and a member selected from the group consisting of phosphoric and fluoboric acids, said bath having a pH value of 1.8.

3. A gold plating bath consisting of a solution made up by mixing sodium gold cyanide, phosphoric acid, and distilled water, said bath having a pH value of 1.8.

4. A gold plating bath consisting of a solution made up by mixing potassium gold cyanide, phosphoric acid, and distilled water, said bath having a pH value of 1.8.

5. A gold plating solution consisting per 1000 cubic centimeters of solution of a mixture of 10 grams of sodium gold cyanide, 13 cubic centimeters of fluoboric acid, and distilled water.

6. A gold plating solution consisting per 1000 cubic centimeters of solution of a mixture of 10 grams of potassium gold cyanide, 13 cubic centimeters of fluoboric acid, and distilled water.

7. A gold plating solution consisting per 1000 cubic centimeters of solution of a mixture of 1–30 grams of sodium gold cyanide, 4–32 cubic centimeters of fluoboric acid, and distilled water.

8. A gold plating solution consisting per 1000 cubic centimeters of solution of a mixture of 1–30 grams of potassium gold cyanide, 4–32 cubic centimeters of fluoboric acid, and distilled water.

References Cited in the file of this patent

UNITED STATES PATENTS

| | | |
|---|---|---|
| 1,104,842 | Smith | July 28, 1914 |
| 2,501,737 | Porter et al. | Mar. 28, 1950 |
| 2,702,271 | Sperter et al. | Feb. 15, 1955 |
| 2,800,439 | Fischer et al. | July 23, 1957 |
| 2,812,299 | Volk | Nov. 5, 1957 |

OTHER REFERENCES

Pritchard: Metal Industry (New York edition), vol. 31 (December 1933), page 408.

Electroplating Engineering Handbook, Reinhold Publishing Corp., 1955, pages 204–205.

Kushner: Products Finishing, June 1941, pp. 76, 78, 79 and 80.

Thews: Metal Finishing, September 1951, pages 80–85.

Ser. No. 233,325, Beck (A.P.C.), published May 18, 1943.